(12) United States Patent
Honma et al.

(10) Patent No.: US 6,596,086 B1
(45) Date of Patent: Jul. 22, 2003

(54) APPARATUS FOR THIN FILM GROWTH

(75) Inventors: Tadaaki Honma, Annaka (JP); Takeshi Arai, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 339 days.

(21) Appl. No.: 09/296,806

(22) Filed: Apr. 23, 1999

(30) Foreign Application Priority Data

Apr. 28, 1998 (JP) ............................................ 10-134382

(51) Int. Cl.[7] .......................... C23C 16/00; C30B 35/00
(52) U.S. Cl. ........................ 118/728; 118/500; 117/200
(58) Field of Search ............................... 118/728, 729, 118/500; 117/200

(56) References Cited

U.S. PATENT DOCUMENTS

| | | | | |
|---|---|---|---|---|
| 5,033,406 A | * | 7/1991 | Lee ............................ 118/500 |
| 5,273,588 A | * | 12/1993 | Foster et al. ............. 118/723 E |
| 5,370,739 A | * | 12/1994 | Foster et al. ................ 118/725 |
| 5,516,367 A | * | 5/1996 | Lei et al. ..................... 118/725 |
| 5,558,717 A | * | 9/1996 | Zhao et al. ................. 118/715 |
| 5,633,073 A | * | 5/1997 | Cheung et al. ............. 428/209 |
| 5,879,128 A | * | 3/1999 | Tietz et al. .................. 414/757 |
| 5,900,062 A | * | 5/1999 | Loewenhardt et al. .. 118/723 R |
| 5,935,338 A | * | 8/1999 | Lei et al. ..................... 118/725 |
| 6,002,109 A | * | 12/1999 | Johnsgard et al. .......... 219/390 |

OTHER PUBLICATIONS

Askeland, The Science and Engineering of Materials, 2nd Ed., PWS–KENT, Boston USA, pp. 460, 1989.*
Askeland, The Science and Engineering of Materials, Second Ed., PWS–Kent Publishing Co., Boston, MA, USA, pp. 764–765, 1989.*

* cited by examiner

Primary Examiner—Benjamin L. Utech
Assistant Examiner—Matthew Anderson
(74) Attorney, Agent, or Firm—Snider & Associates; Ronald R. Snider

(57) ABSTRACT

In an apparatus for vapor phase growth of silicon single crystal thin films, in-plane uniformity of susceptor temperature is improved and film thickness of a silicon single crystal thin film is uniformized. The base material of a lift pin 8 provided in a pocket 5a of a susceptor 5 is changed to a base material lower in thermal conductivity than a base material of the susceptor 5, by which local decreases in susceptor temperature in the vicinity of the lift pin are prevented. As the base material of the lift pin 8, SiC, carbon of a desired grade and quartz are preferred.

5 Claims, 6 Drawing Sheets

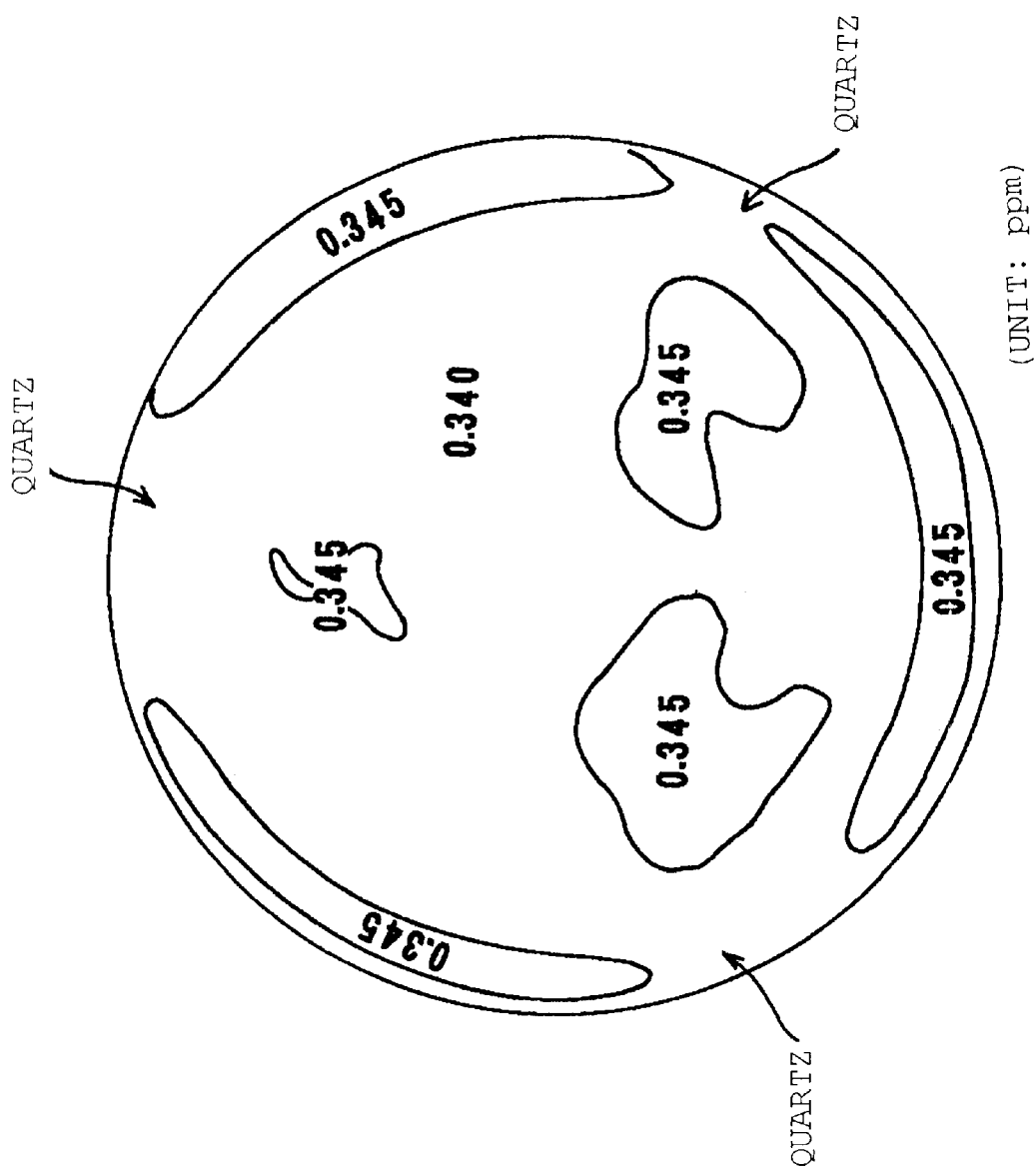
F I G. 5

(UNIT: μm)

APPARATUS FOR THIN FILM GROWTH

RELATED APPLICATION

This application claims the priority of Japanese Patent Application No. 10-134382 filed on Apr. 28, 1998, which is incorporated herein by reference.

BACKGROUND OF THE INVENTION

This invention relates to an apparatus for thin film growth and, more specifically, to an improvement in temperature uniformity in an apparatus for growth of silicon single crystal thin films.

Design rules for semiconductor devices are coming to reach the order of sub-quarter microns in practical level. As the amount of charges handled by semiconductor devices is decreased as a result of micro-structuring of the devices, the possibility that even slight micro defects in the vicinity of the wafer surface have critical effects on device characteristics becomes larger than ever, so that performance deteriorations particularly in bipolar circuits and CMOS circuits matter.

Therefore, it can be predicted that, from now on, mirror polished wafers fabricated by slicing and polishing a silicon single crystal ingot pulled up from the melt solution is increasingly substituted by use of silicon epitaxial wafers in which a silicon single crystal thin film is grown in vapor phase further on the surface of the mirror-polished wafer.

For silicon epitaxial wafers, there is a demand for high degree of thickness uniformity. This thickness uniformity may be expressed alternatively as the flatness of the silicon epitaxial layer grown in vapor phase on the mirror-polished wafer, because the original mirror-polished wafer has a high degree of flatness. The demand for high degree of flatness is due to a need of gaining as much process margin as possible, since exposure light used for recent years' photolithography has been shortened in wavelength down to far ultraviolet wavelength region so that the depth of focus has been considerably reduced. Still, this demand becomes increasingly stricter as the wafer diameter is enlarged from existing 200 mm to 300 mm and further beyond.

FIG. 1 shows one arrangement example of a single-wafer type vapor phase growth apparatus 10. This apparatus is designed to perform vapor phase epitaxial growth while heating a wafer W, which is set one at a time within a process vessel (reaction+vessel) 1 made of transparent quartz, from above and below with infrared lamps 9.

The process vessel 1 is internally divided into an upper space 1a and a lower space 1b by a susceptor 5 for placing the wafer W thereon. In this upper space 1a, raw material gas introduced through a gas supply port 2 along with $H_2$ gas, which is a carrier gas, flows on the surface of the wafer W in a direction of arrow A in the figure while forming nearly a laminar flow, and is discharged through an exhaust port 4 on the opposite side. To the lower space 1b, $H_2$ gas, which is the purge gas, is supplied at a pressure higher than that for the raw material gas. The reason of higher pressure for the purge gas is to prevent the raw material gas from entering the lower space 1b through clearances between the process vessel 1 and the susceptor 5.

In the lower space 1b are contained support means made of quartz and serving for supporting the susceptor 5 on its rear face, and a lift pin 8 for setting and removing the wafer W on the susceptor 5.

The support means comprises a rotating shaft 6, and a plurality of spokes 7 radially branched from a tip end portion of the rotating shaft 6. Vertical pins 7b are provided at distal ends of the spokes 7, and tip ends of the vertical pins 7b are brought into contact with the rear face of the susceptor 5, by which the susceptor 5 is supported. The rotating shaft 6 can be rotated by unshown driving means in a direction of arrow C in the figure.

The lift pin 8 is enlarged in diameter at its head portion, and this head portion is hung on a tapered side wall portion of a through hole 5b provided at the bottom face of a pocket 5a of the susceptor 5 for placing the wafer W thereon. Shaft portion of the lift pin 8 is inserted into a through hole 7a bored midway in the spokes 7, so that the lift pin 8 is hung down stably.

The wafer W is set and removed on the susceptor 5 by up and down movement of the support means. For example, when the wafer W is removed from the susceptor 5, the support means is lowered until the tail portion of the lift pin 8 makes contact with the inside wall of the lower space 1b of the process vessel 1 as shown in FIG. 2. The lift pin 8 resultantly biased collides against the rear face of the wafer W at its head portion, causing the wafer W to come up above the pocket 5a. After that, with a handler inserted into the space between the susceptor 5 and the wafer W, the wafer W is delivered and conveyed.

The material of the susceptor 5 is commonly given by a carbon base material coated with SiC (silicon carbide). The selection of carbon as the base material is attributed partly to the fact that the most popular heating system for vapor phase growth apparatus in their early development stages was high frequency induction heating, and besides partly to such merits of carbon as easiness to obtain high-purity products, easiness to process, superiority in thermal conductivity, resistance to breakage and the like. However, because of some problems, for example, that carbon is a porous substance and so may emit occluded gas during the process, and that carbon and raw material gas react with each other to cause the surface of the susceptor to change to SiC in the process of silicon epitaxial growth, the structure that the surface of carbon base material is coated with SiC from the beginning. The SiC coating is deposited commonly by CVD (Chemical Vapor Deposition).

The material of the lift pin 8 is given by a SiC-coated carbon base material, like the susceptor 5.

Whereas the demand for the flatness of epitaxial wafers has been growing stricter year by year, it has been found out that the epitaxial layer has thickness differences depending on the position in the surface of the epitaxial wafer even with single-wafer type vapor phase growth apparatus devised in terms of structure and material as described above. In particular when the thickness of the epitaxial layer exceeds approximately 8 μm, thickness differences in the surface of the epitaxial layer tend to increase noticeably to a level undesirable for practical use.

In a case where a p-type silicon epitaxial layer (resistivity=10 Ω·cm) is grown in vapor phase with a target thickness of 15 μm on a 200 mm-dia. $P^+$-type, (100)-oriented single crystal silicon substrate, FIG. 6 shows flatnesses of the layer. This figure is a mapping of flatness on the wafer, where with the whole wafer surface divided into 20 mm square cells, their maximum values of differences in elevation between a reference plane determined by the best fit method and projected portions or recessed portions generated in the individual cells are represented in absolute value (SFQD pursuant to the definition of SEMI). From this figure, it can be seen that differences in thickness of the epitaxial layer are extremely large at edge portions generally falling upon tripartite points of the circumference. These are impermissible for practical use.

SUMMARY OF THE INVENTION

Therefore, it is an object of the present invention to provide a thin film growth apparatus capable of improving the film thickness uniformity of produced silicon single crystal thin films.

Focusing attention on the fact that points of worse numerical values in the mapping of flatness shown in FIG. 6 mentioned above are generally coincident with the fulcrums of the lift pin, the present inventors set up a tentative theory that heat of the susceptor was absorbed by the lift pin and dissipated at those points of worse values so that the wafer temperature was locally lowered and the film thickness uniformity of the epitaxial layer was deteriorated. The inventors verified that successful results can be obtained by changing the base material of the lift pin to one having a thermal conductivity lower than that of the susceptor base material according to this theory, thus having reached the proposal of this invention.

According to the invention, there is provided an apparatus for thin film growth in which with a substrate placed on a susceptor set in a process vessel (reaction vessel), a silicon single crystal thin film is grown in vapor phase on the substrate while raw material gas is supplied into the process vessel, where a lift pin to be inserted into a through hole bored in a pocket of the susceptor serving for placement of the substrate is made of a base material lower in thermal conductivity than a base material of the susceptor.

According to the invention, by changing the base material of the lift pin, the vapor phase growth apparatus of the invention is enabled to prevent any temperature decrease in the vicinity of the lift pin position and to improve the temperature distribution of the wafer surface, and as a result, to suppress variations in film thickness of the silicon epitaxial layer to the order of 0.01 μm in the vicinity of the lift pin position. Accordingly, yield of semiconductor devices formed on the epitaxial wafer can be improved and besides quality trouble of semiconductor devices can be prevented in advance.

The invention is a technique for enhancing the practical performance of single-wafer type vapor phase growth apparatus that can be expected to become popular with the trend toward larger diameters of wafers, being of exceedingly high industrial value in the semiconductor manufacturing field.

BRIEF DESCRIPTION OF THE DRAWINGS

FIG. 5 is a schematic view showing a distribution of minute recesses and projections in the wafer surface when three lift pins made of quartz are used for one silicon single crystal wafer.

DETAILED DESCRIPTION OF THE PREFERRED EMBODIMENTS

In the invention, a base material of the lift pin 8 having a thermal conductivity lower than that of the susceptor's base material is selected so that heat radiation from the lift pin 8 is suppressed, thus making it possible to reduce temperature decreases of the wafer in the vicinity of the lift pin 8. More preferably, a base material of the lift pin 8 having a thermal conductivity of not more than 40 W/mK at 1000° C. is selected. This consideration to the thermal conductivity at 1000° C. is due to a requirement that characteristics of the base material be evaluated in a temperature range in which the growth of a silicon single crystal thin film is actually carried out.

As the base material of the lift pin 8 that satisfies these conditions, the inventors have found out that those listed in Table 1 below are preferred:

TABLE 1

| | | (Value at 1000° C.) | |
|---|---|---|---|
| | Constituent | Thermal conductivity (W/mK) | |
| | material | Base material | SiC coating |
| Lift pin of invention | Carbon + SiC coating | 40 | 31 |
| | SiC + SiC coating | 35 | 31 |
| | Quartz | 2 | — |
| Lift pin of prior art | Carbon + SiC coating | 130 | 31 |
| Susceptor | Carbon + SiC coating | 130 | 31 |

Conventionally, carbons common to those used for the susceptor have been used as the base material of the lift pin 8, and its thermal conductivity at 1000° C. has usually been not less than 80 W/mK. However, among carbons, those having a thermal conductivity as low as 40 W/mK are available depending on the degree of crystallization. When carbon is used as the base material, there is a need of forming a SiC coating, as in the prior art, in order to prevent the release of impurities and occluded gas from the base material as well as the reaction between raw material gas and base material surface during the growth of the silicon single crystal thin film.

Also preferably, the base material may be a SiC having a thermal conductivity lower than carbon. Whereas SiC crystal cut out by machining may be used as the lift pin as it is, this may involve occurrence of machining strain. Therefore, in order to obtain a lower thermal conductivity, it is more effective to add SiC coating by CVD.

Quartz is a material showing a thermal conductivity considerably lower than carbon and SiC. Therefore, quartz is preferably used as it is pure without forming SiC coating.

Hereinbelow, concrete examples of the invention are described.

Figure 1:
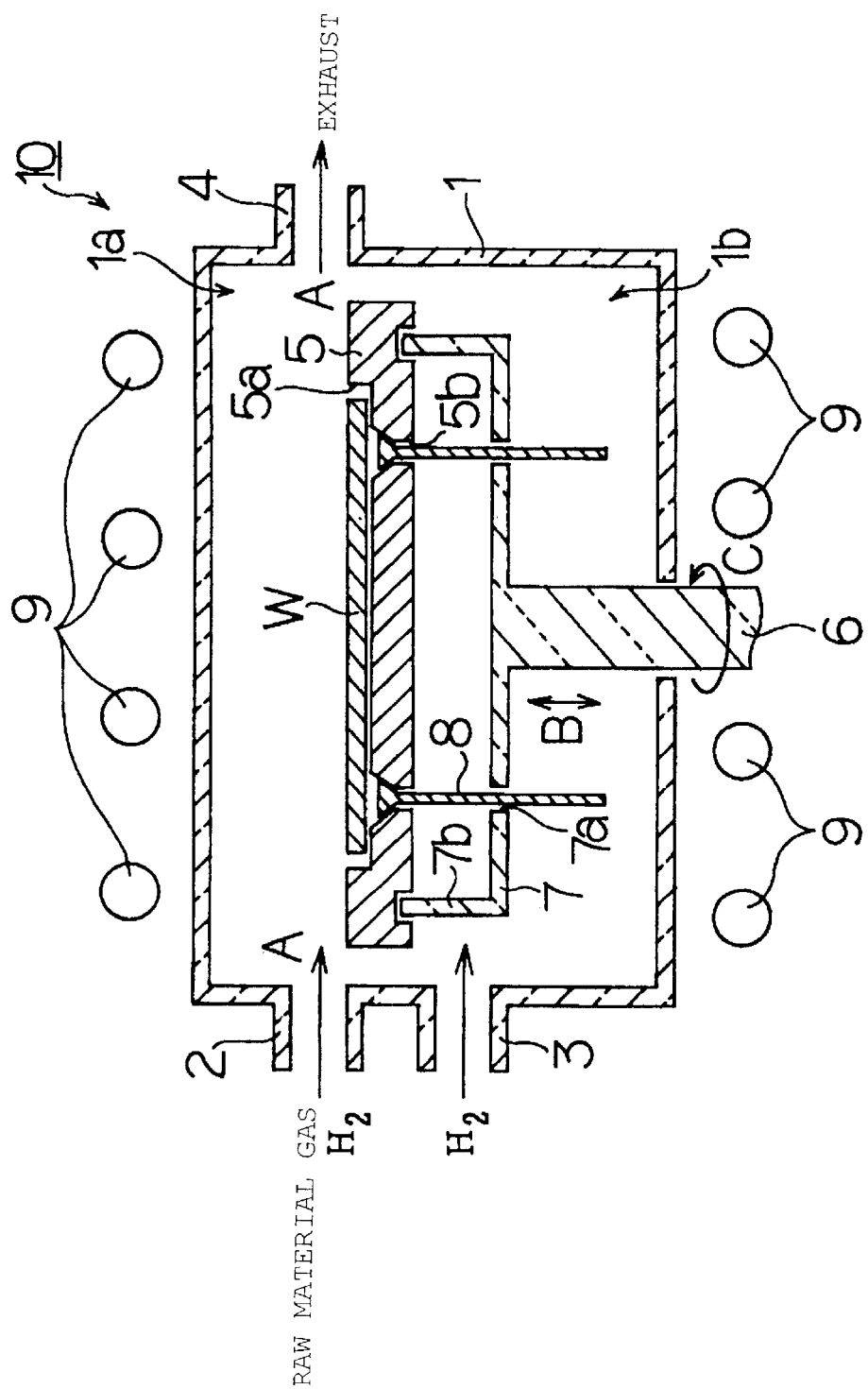
FIG. 1 is a schematic sectional view showing a typical arrangement example of vapor phase growth apparatus in a state of use during the vapor phase growth.
Figure 2:
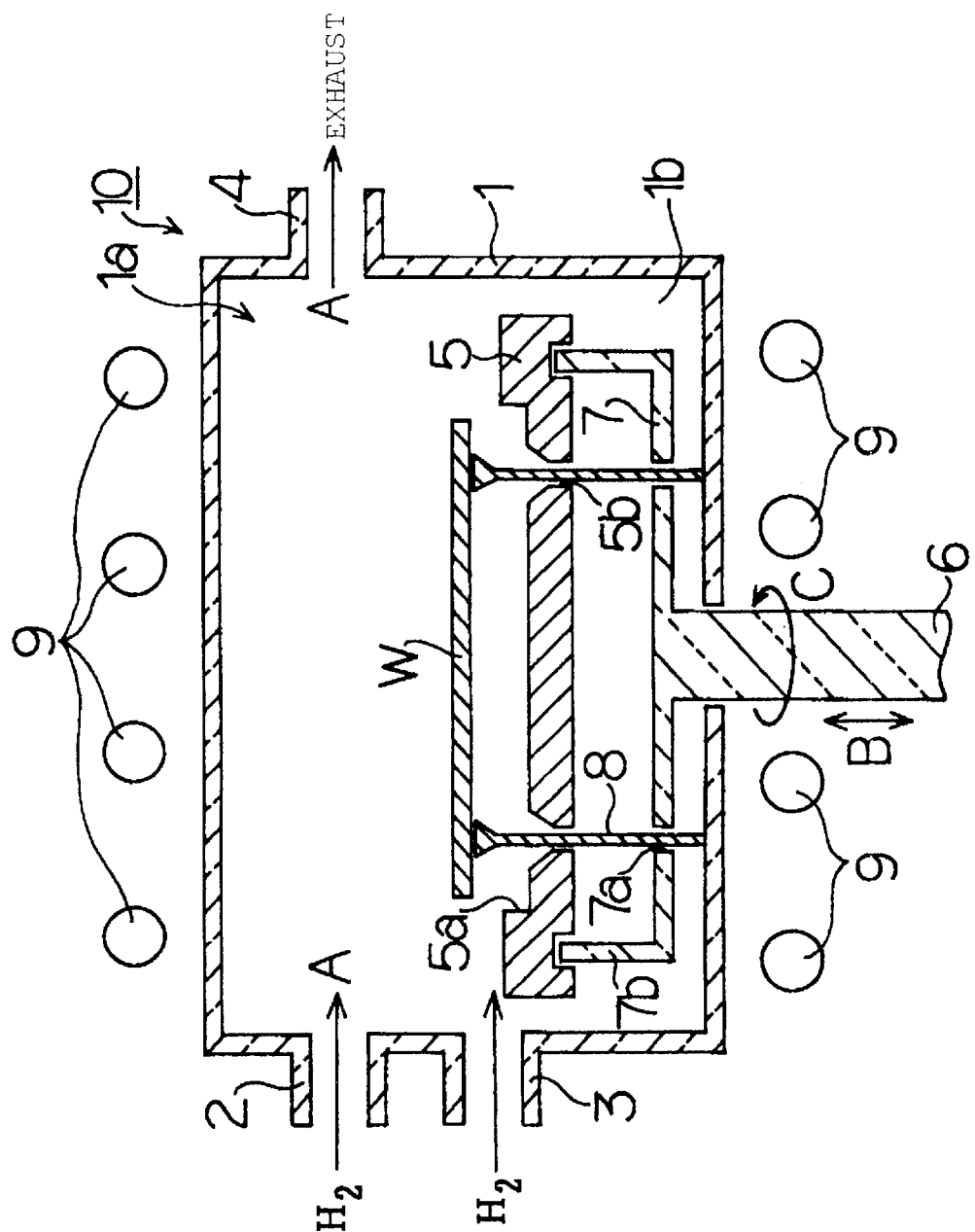
FIG. 2 is a schematic sectional view showing a typical arrangement example of vapor phase growth apparatus in a state that the wafer has been lifted from the susceptor with lift pins.

With a vapor phase growth apparatus 10 shown in FIG. 1 mentioned above, four types of lift pins 8 were fabricated with materials shown in the above Table 1, and set to a susceptor made of a carbon base material having a thermal conductivity of 130 W/mK coated with SiC. In this state, on a 200 mm-dia. p$^+$-type, (100)-oriented silicon single crystal substrate, a 15 μm thick, p-type silicon epitaxial layer (resistivity=10 Ω·cm) was grown in vapor phase, in which case the film thickness of the epitaxial layer in the vicinities of the positions where the lift pins 8 were located as well as the surface state of the epitaxial layer over the whole wafer were examined.

Conditions of epitaxial growth were as follows, as an example:

$H_2$ annealing conditions: 1130° C., 45 sec., epitaxial growth temperature: 1130° C., flow rate of $H_2$ flow: 40 liters/min., flow rate of raw material gas ($SiHCl_3$ diluted with $H_2$): 12 liters/min., flow rate of dopant ($B_2H_6$ diluted with $H_2$): 100 ml/min.

With respect to the lift pins 8 used in this case, the diameter of the head portion was 7.0 mm, the diameter of the shaft portion was 3.2 mm and the length of the shaft portion was 14 cm.

Figure 3:
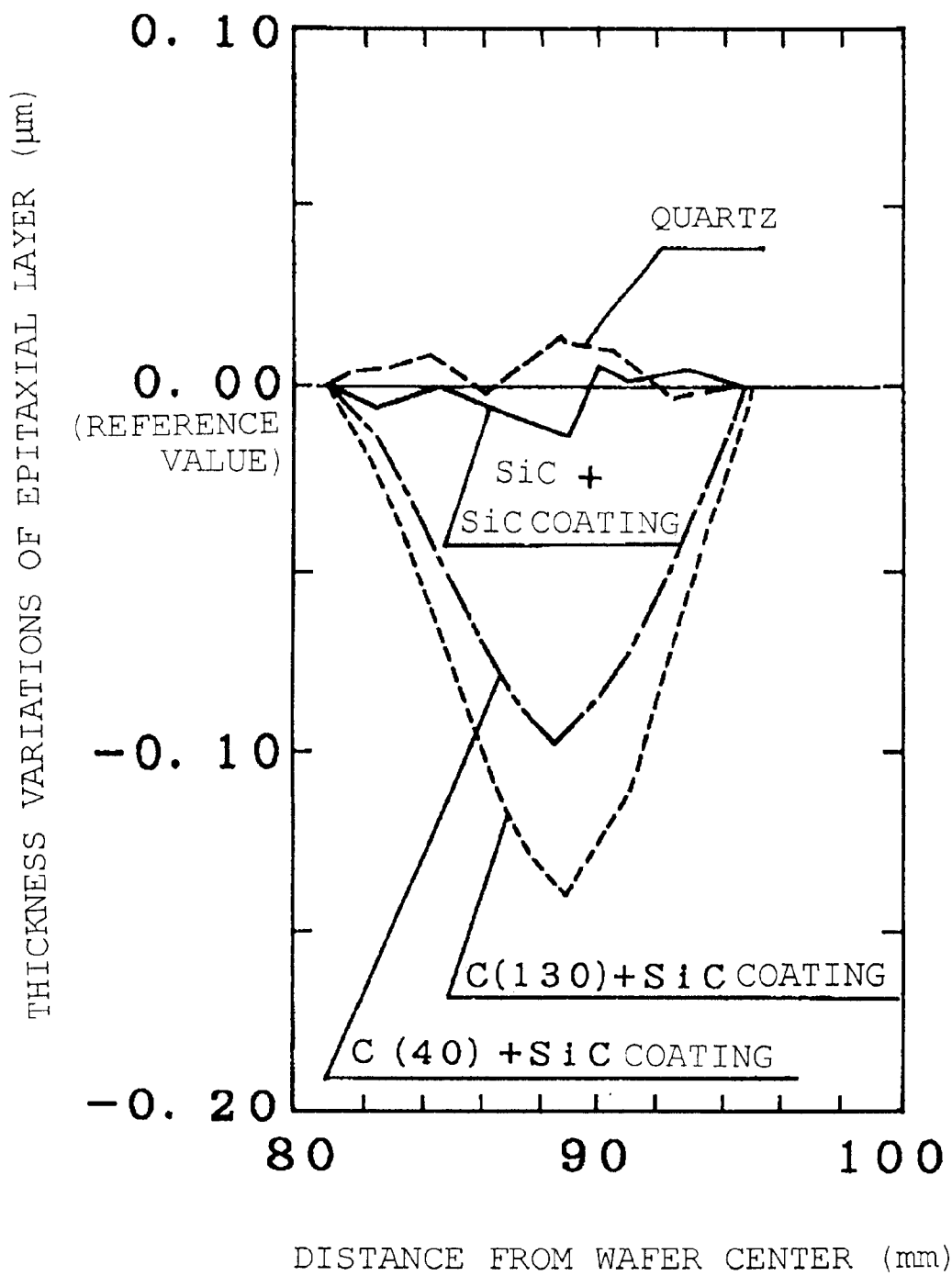
FIG. 3 is a graph comparing thickness variations of the silicon epitaxial layer in the vicinities of the lift pins among various base materials of the lift pins.

FIG. 3 shows thickness distributions of the silicon epitaxial layer in the vicinities of the positions where the lift pins 8 were located, as a result of measurement by the infrared interference method. Thickness variations of the epitaxial layer in the vertical axis are represented in values which were obtained by taking, as reference values, a layer thickness value at the measuring point nearest to the center and a layer thickness value at the most peripheral measuring point among layer thickness measured values, and by proportionally converting differences in elevation of the epitaxial layer relative to the reference values. In addition, C(130) represents a carbon having a thermal conductivity of 130 W/mK at 1000° C., which corresponds to the conventional base material of lift pins. Also, C(40) represents a carbon of 40 W/mK, which corresponds to the base material used in the invention.

As seen in this figure, with C(130) used as the base material of the lift pin, the silicon epitaxial layer depressed 0.14 μm below the reference plane in the vicinity of the lift pin, whereas this depression was improved to 0.10 μm with the use of C(40) as the base material in the present invention.

With SiC used as the base material, the depression was suppressed to as small as 0.01 μm.

It was further found that with the use of quartz, the silicon epitaxial layer tends to, conversely, be projected above the reference plane.

From these results, it was found that by changing the base material of the lift pin 8 to ones lower in thermal conductivity than the base material of the susceptor, local temperature decreases of the wafer in the vicinity of the lift pin 8 can be prevented, and that the thickness uniformity of the silicon epitaxial layer is improved.

Next, the distribution of minute recesses and projections generated in the surface of the epitaxial layer was examined for the whole wafer surface. In this case, an experiment in which a silicon epitaxial layer was grown in vapor phase with totally three types of lift pins 8, C(40)+SiC coating, SiC+SiC coating and, for comparison, C(130)+SiC coating, one lift pin per type, set to one silicon single crystal substrate, and an experiment in which a silicon epitaxial layer was grown in vapor phase with three lift pins 8 all made of quartz mounted, were conducted.

Figure 4:
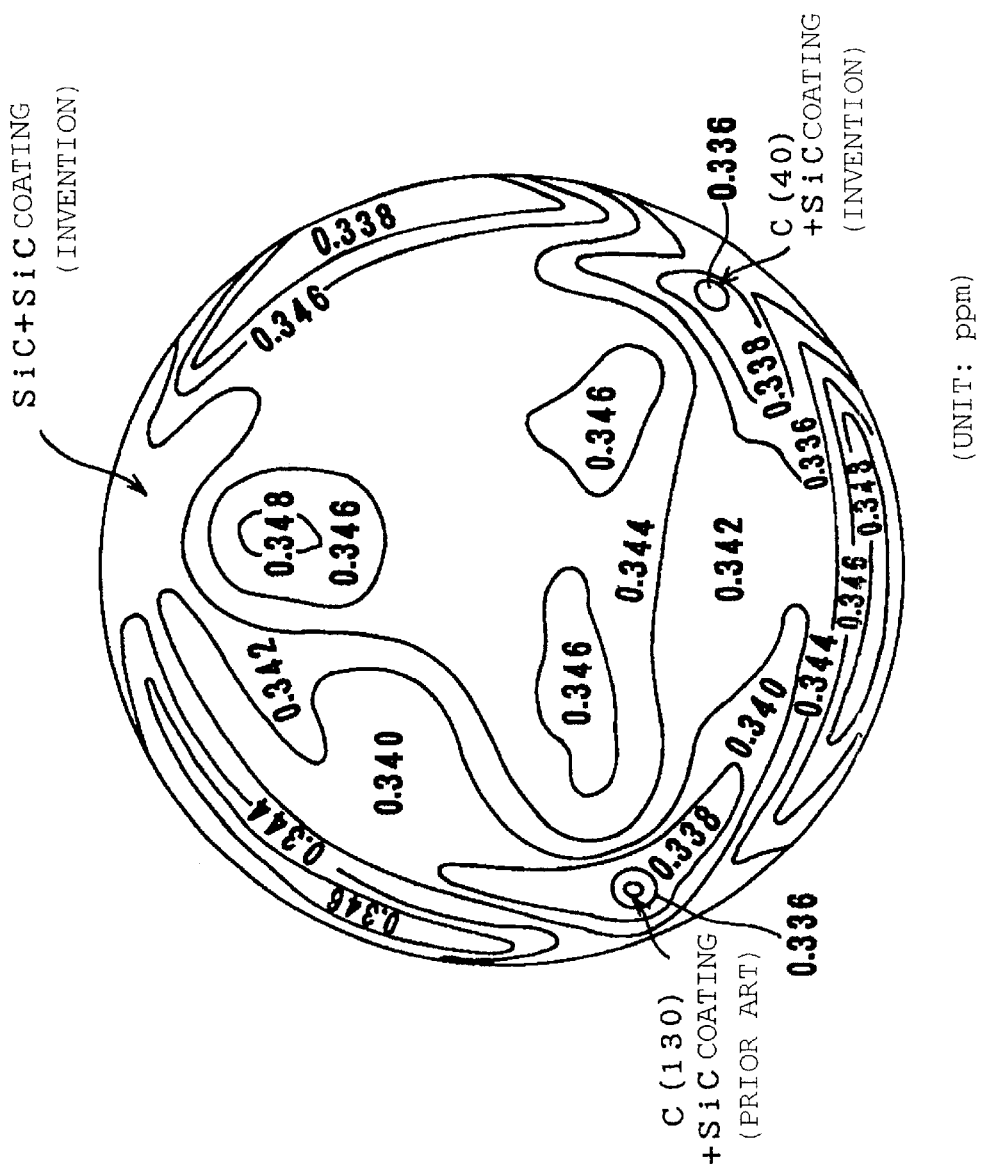
FIG. 4 is a schematic view showing a distribution of minute recesses and projections in the wafer surface when lift pins made of three types of base materials, one lift pin per type, were used for one silicon single crystal wafer.
Figure 6:
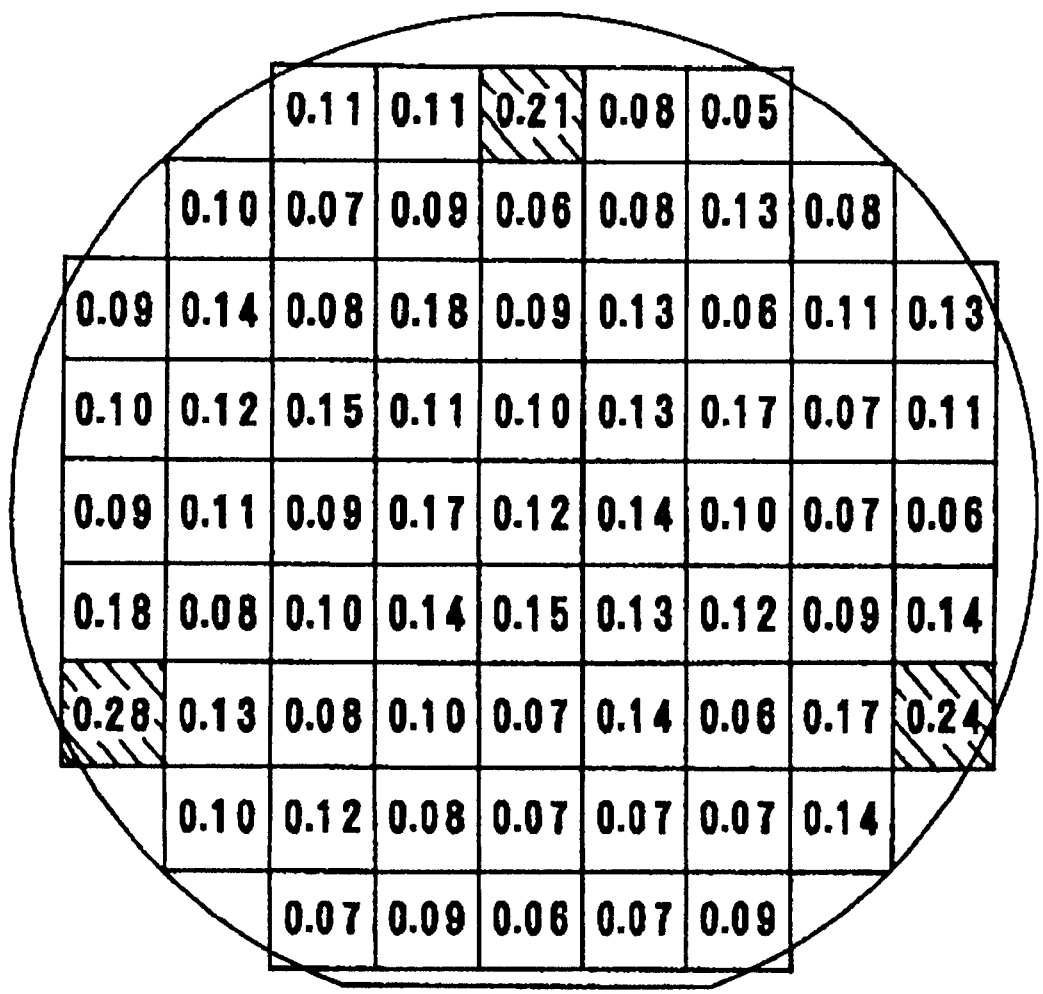
FIG. 6 is a view of mapping flatnesses on the wafer with respect to a silicon epitaxial layer grown with a single-wafer type vapor phase growth apparatus according to the prior art.

FIG. 4 shows results of measuring the distribution of minute recesses and projections in the wafer surface with laser diffused light detection equipment, in the case where the three types of lift pins 8 were used at a time. Pointing ends of the arrows in the figure correspond to the positions of the lift pins 8. Also, the smaller the values (unit: ppm) of the minute recesses and projections of a region are, the lower the wafer surface temperature of the region is, relatively.

As seen in the figure, a largely spread low-temperature region can be seen in the vicinity of the lift pin of C(130)+SiC coating, whereas this spread is somewhat narrower and besides the maximum values of minute recesses and projections are also somewhat small in the case of the lift pin of C(40)+SiC coating. Further, since no local changes in the minute recesses and projections were observed in the vicinity of the lift pin of SiC+SiC coating, it became clear that the low-temperature region was solved almost all.

FIG. 5 shows a distribution of minute recesses and projections in the wafer surface when lift pins 8 made of quartz were used, with the same equipment as in the measurement of FIG. 4. This figure differs in display scale from above-mentioned FIG. 5. From this figure, it is apparent that temperature decreases were solved almost all in the vicinities of the lift pins made of quartz.

Although concrete examples of the invention have been described hereinabove, the invention is not limited to these examples. For example, various changes, selection and combinations may be made, as required, in configuration and size of the lift pin, the number of spokes branched from the tip end portion of the rotary shaft, the diameter of wafer used, conditions of vapor phase growth of silicon single crystal thin films, and details of the structure of the single-wafer type vapor phase growth apparatus.

What is claimed is:

1. The apparatus for thin film growth in which with a substrate placed on a susceptor set in a process vessel, a silicon single crystal thin film is grown in vapor phase on the substrate while raw material gas is supplied into the process vessel, characterized in that the apparatus for thin film growth has a lift pin made of a base material lower in thermal conductivity than a base material of the susceptor which is inserted into a through hole bored in a pocket of the susceptor serving for placement of the substrate, wherein the lift pin is capable of being lifted or lowered so as to be brought into or out of contact with a rear surface of the substrate, such lowering or lifting allowing the substrate to be, respectively, set on or removed on the susceptor, wherein the base material of the lift pin is SiC whose thermal conductivity is not more than 40 w/mK at 1000° C., wherein the susceptor is made of a carbon base material coated with SiC.

2. An apparatus for thin film growth in which with a substrate placed on a susceptor set in a process vessel, a silicon single crystal thin film is grown in vapor phase on the substrate while raw material gas is supplied into the process vessel, characterized in that the apparatus for thin film growth has a lift pin made of a base material lower in thermal conductivity than a base material of the susceptor which is inserted into a through hole bored in a pocket of the susceptor serving for placement of the substrate, wherein the lift pin is capable of being lifted or lowered so as to be brought into or out of contact with a rear surface of the substrate, such lowering or lifting allowing the substrate to be, respectively, set on or removed on the susceptor, wherein the base material of the lift pin is carbon whose thermal conductivity is not more than 40 w/mK at 1000° C.

3. The apparatus for thin film growth according to claim 2, wherein the susceptor is made of a carbon base material coated with SiC.

4. An apparatus for thin film growth in which with a substrate placed on a susceptor set in a process vessel, a silicon single crystal thin film is grown in vapor phase on the substrate while raw material gas is supplied into the process vessel, characterized in that the apparatus for thin film growth has a lift pin made of a base material lower in thermal conductivity than a base material of the susceptor which is inserted into a through hole bored in a pocket of the susceptor serving for placement of the substrate, wherein the lift pin is capable of being lifted or lowered so as to be brought into or out of contact with a rear surface of the substrate, such lowering or lifting allowing the substrate to be, respectively, set on or removed on the susceptor, wherein the base material of the lift pin is quartz whose thermal conductivity is not more than 40 w/mK at 1000° C.

5. The apparatus for thin film growth according to claim 4, wherein the susceptor is made of a carbon base material coated with SiC.

* * * * *